United States Patent
Mun et al.

(10) Patent No.: US 12,191,351 B1
(45) Date of Patent: Jan. 7, 2025

(54) LATERALLY-DIFFUSED METAL-OXIDE-SEMICONDUCTOR DEVICES WITH AN AIR GAP

(71) Applicant: GlobalFoundries Singapore Pte. Ltd., Singapore (SG)

(72) Inventors: Bong Woong Mun, Singapore (SG); Jeffrey B. Johnson, North Hero, VT (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/663,563

(22) Filed: May 14, 2024

(51) Int. Cl.
| | |
|---|---|
| H01L 29/06 | (2006.01) |
| H01L 21/764 | (2006.01) |
| H01L 29/40 | (2006.01) |
| H01L 29/66 | (2006.01) |
| H01L 29/78 | (2006.01) |

(52) U.S. Cl.
CPC ........ H01L 29/0649 (2013.01); H01L 21/764 (2013.01); H01L 29/407 (2013.01); H01L 29/66704 (2013.01); H01L 29/7813 (2013.01)

(58) Field of Classification Search
CPC ............. H01L 21/7682; H01L 29/0649; H01L 21/764; H01L 29/4991; H01L 2221/1042
See application file for complete search history.

(56) References Cited

U.S. PATENT DOCUMENTS

| | | | |
|---|---|---|---|
| 10,211,146 B2 | 2/2019 | He et al. | |
| 10,461,152 B2 | 10/2019 | Stamper et al. | |
| 10,629,727 B2 | 4/2020 | Birner et al. | |
| 2011/0084340 A1 | 4/2011 | Yuan et al. | |
| 2012/0248528 A1 | 10/2012 | Wilson et al. | |
| 2023/0079098 A1* | 3/2023 | Togo | ...... H10B 43/40 257/345 |
| 2023/0102936 A1* | 3/2023 | Lee | ...... H01L 29/512 257/288 |

(Continued)

FOREIGN PATENT DOCUMENTS

CN          112397591 A          2/2021

OTHER PUBLICATIONS

S. Mehrotra et al., "Towards ultimate scaling of LDMOS with Ultralow Specific On-resistance," 2020 32nd International Symposium on Power Semiconductor Devices and ICs (ISPSD), Vienna, Austria, 2020, pp. 42-45, doi: 10.1109/ISPSD46842.2020.9170198.

*Primary Examiner* — Wasiul Haider
(74) *Attorney, Agent, or Firm* — Thompson Hine LLP; Francois Pagette

(57) ABSTRACT

Structures for a laterally-diffused metal-oxide-semiconductor device and methods of forming same. The structure comprises a semiconductor substrate including a trench, a source and a drain in the semiconductor substrate, a dielectric layer inside the trench, and a gate in the dielectric layer. The trench has a first sidewall and a second sidewall, the source is adjacent to the first sidewall of the trench, the drain is adjacent to the second sidewall of the trench, and the gate is laterally between the first sidewall of the trench and the second sidewall of the trench. The structure further comprises an air gap in the dielectric layer. The air gap is below the gate, and the air gap is laterally between the first sidewall of the trench and the second sidewall of the trench.

20 Claims, 5 Drawing Sheets

(56) References Cited

U.S. PATENT DOCUMENTS

2023/0273856 A1* 8/2023 Liu .................... G06F 11/0772
                                                    714/6.22
2024/0105784 A1* 3/2024 Siemieniec ....... H01L 29/66348

* cited by examiner

LATERALLY-DIFFUSED METAL-OXIDE-SEMICONDUCTOR DEVICES WITH AN AIR GAP

BACKGROUND

The disclosure relates generally to semiconductor devices and integrated circuit fabrication and, more specifically, to structures for a laterally-diffused metal-oxide-semiconductor device and methods of forming same.

High-voltage integrated circuits used, for example, in microwave/radiofrequency power amplifiers typically require specialized device structures capable of withstanding higher voltages. Laterally-diffused metal-oxide-semiconductor devices incorporate features, such as an extended drain, that promote the higher voltage handling capability. The performance of a laterally-diffused metal-oxide-semiconductor device involves a tradeoff between the breakdown voltage and the figure of merit given by the product of the specific on-resistance and the gate charge.

Improved structures for a laterally-diffused metal-oxide-semiconductor device and methods of forming same are needed.

SUMMARY

In an embodiment, a structure for a laterally-diffused metal-oxide-semiconductor device is provided. The structure comprises a semiconductor substrate including a trench, a source and a drain in the semiconductor substrate, a dielectric layer inside the trench, and a gate in the dielectric layer. The trench has a first sidewall and a second sidewall, the source is adjacent to the first sidewall of the trench, the drain is adjacent to the second sidewall of the trench, and the gate is laterally between the first sidewall of the trench and the second sidewall of the trench. The structure further comprises an air gap in the dielectric layer. The air gap is below the gate, and the air gap is laterally between the first sidewall of the trench and the second sidewall of the trench.

In an embodiment, a method of forming a structure for a laterally-diffused metal-oxide-semiconductor device is provided. The method comprises forming a trench in a semiconductor substrate, forming a dielectric layer inside the trench, forming a source in the semiconductor substrate, forming a drain in the semiconductor substrate, forming an air gap in the dielectric layer, and forming a gate in the dielectric layer. The trench has a first sidewall and a second sidewall, the source is adjacent to the first sidewall of the trench, the drain is adjacent to the second sidewall of the trench, the air gap is laterally between the first sidewall of the trench and the second sidewall of the trench, the gate is laterally between the first sidewall of the trench and the second sidewall of the trench, and the air gap is below the gate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
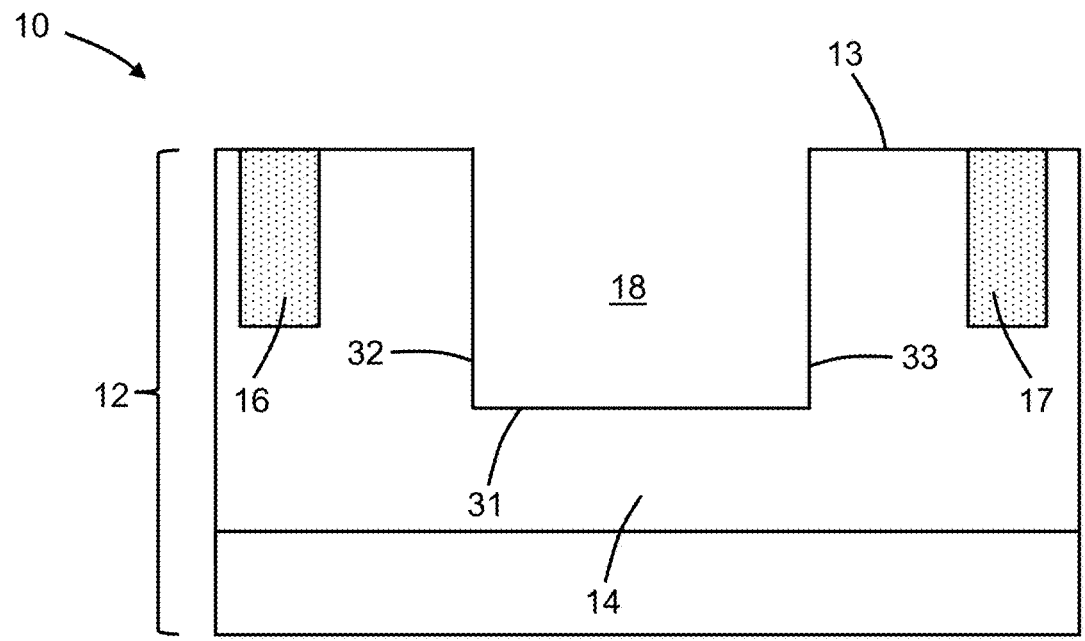
FIG. 1 is a cross-sectional view of a structure in accordance with embodiments of the invention.

With reference to FIG. 1 and in accordance with embodiments of the invention, a structure 10 for a laterally-diffused metal-oxide-semiconductor device includes a semiconductor substrate 12, a high-voltage well 14 in the semiconductor substrate 12, and shallow trench isolation regions 16, 17 in the semiconductor substrate 12. The semiconductor substrate 12 may be comprised of a semiconductor material, such as single-crystal silicon. In an embodiment, the high-voltage well 14 may be lightly doped with a concentration of an n-type dopant (e.g., arsenic or phosphorus) such that the high-voltage well 14 has n-type conductivity. In an embodiment, the high-voltage well 14 may be formed by introducing a dopant, such as an n-type dopant, by ion implantation into the semiconductor substrate 12. The implantation conditions, such as ion species, dose, and kinetic energy, may be selected to tune the electrical and physical characteristics of the high-voltage well 14. The shallow trench isolation regions 16, 17 may be formed by patterning shallow trenches in the semiconductor substrate 12 with lithography and etching processes, depositing a dielectric material, such as silicon dioxide, in the shallow trenches, and recessing and/or planarizing the deposited dielectric material.

A trench 18 may be patterned by lithography and etching processes in a portion of the semiconductor substrate 12 and, more specifically, in a portion of the high-voltage well 14 laterally between the shallow trench isolation region 16 and the shallow trench isolation region 17. To that end, an etch mask may be formed by a lithography process over the semiconductor substrate 12. The etch mask may include a layer of a photoresist applied by a spin-coating process, pre-baked, exposed to light projected through a photomask, baked after exposure, and developed with a chemical developer to define an opening at the intended location for the trench 18. An etching process is used to form the trench 18 at the location of the opening in the etch mask. The etch mask may be stripped after forming the trench 18.

The trench 18 may extend from a top surface 13 of the semiconductor substrate 12 partially through the high-voltage well 14. The trench 18 may have a sidewall 32 adjacent to the shallow trench isolation region 16, a sidewall 33 adjacent to the shallow trench isolation region 17, and a bottom 31 that connects the sidewall 32 to the sidewall 33. The semiconductor material of the semiconductor substrate 12, and more specifically, the high-voltage well 14 is coextensive with the sidewalls 32, 33 and the bottom 31 of the trench 18.

Figure 2:
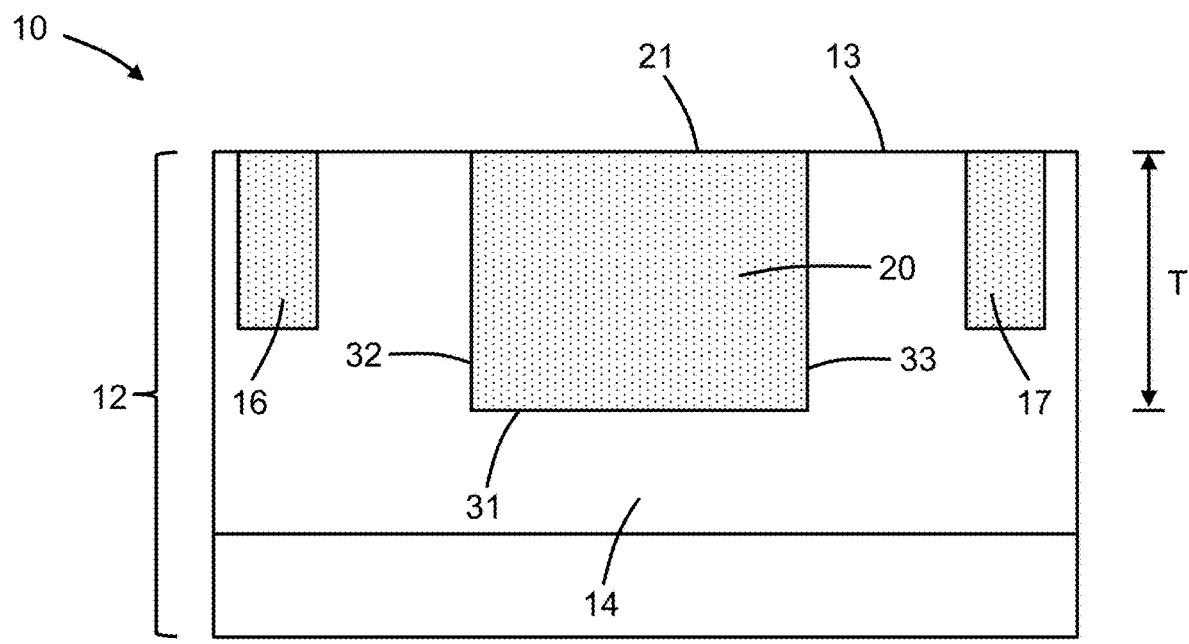
FIG. 2 is a cross-sectional view of the structure at a fabrication stage subsequent to FIG. 1.

With reference to FIG. 2 in which like reference numerals refer to like features in FIG. 1 and at a subsequent fabrication stage, a dielectric layer 20 may be formed inside the trench 18. The dielectric layer 20 may be comprised of a dielectric material, such as silicon dioxide. A portion of the semiconductor material of the semiconductor substrate 12 is laterally disposed between the dielectric layer 20 in the trench 18 and the shallow trench isolation region 16. A portion of the semiconductor material of the semiconductor substrate 12 is also laterally disposed between the dielectric layer 20 in the trench 18 and the shallow trench isolation region 17. In an embodiment, the dielectric layer 20 may fully fill the trench 18. The dielectric layer 20 may have a thickness T that is equal to the depth of the trench 18.

Figure 3:
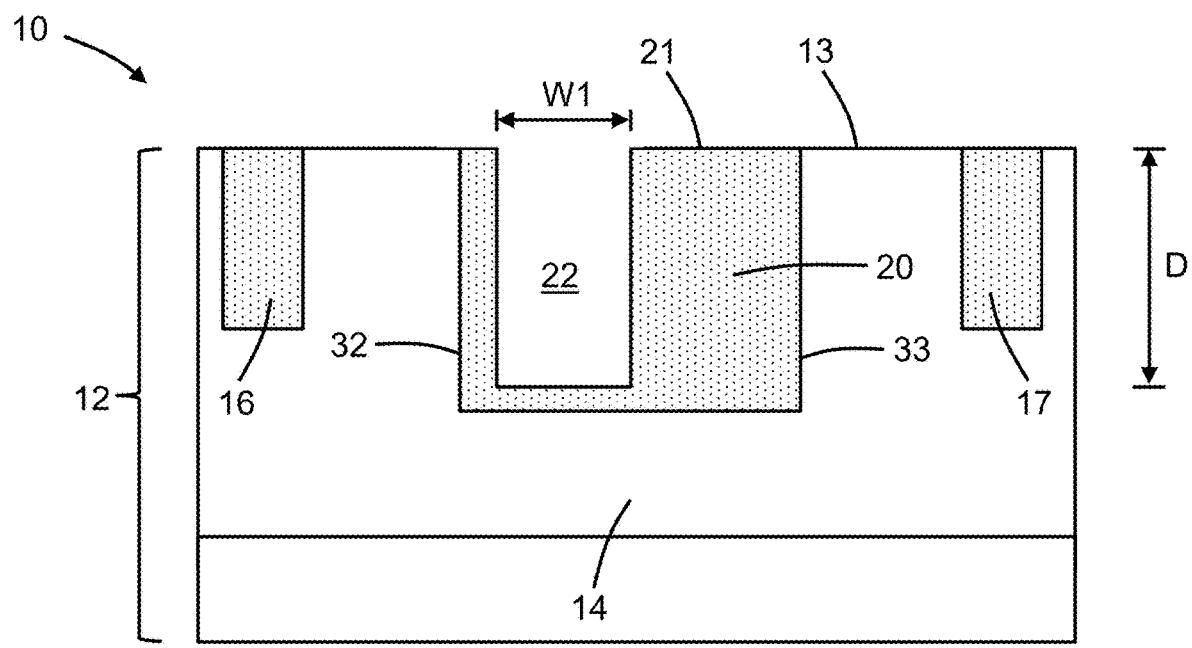
FIG. 3 is a cross-sectional view of the structure at a fabrication stage subsequent to FIG. 2.

With reference to FIG. 3 in which like reference numerals refer to like features in FIG. 2 and at a subsequent fabrication stage, a cavity 22 may be patterned in a portion of the dielectric layer 20 by lithography and etching processes. To that end, an etch mask may be formed by a lithography process over the semiconductor substrate 12. The etch mask may include a layer of a photoresist applied by a spin-coating process, pre-baked, exposed to light projected through a photomask, baked after exposure, and developed with a chemical developer to define an opening at the intended location for the cavity 22. An etching process is used to form the cavity 22 in the dielectric layer 20 at the location of the opening in the etch mask. The etch mask may be stripped after forming the cavity 22.

The cavity 22 may penetrate from the top surface 21 of the dielectric layer 20 partially through the dielectric layer 20. In an embodiment, the cavity 22 may penetrate to a depth D that is less than the thickness T of the dielectric layer 20. The cavity 22 may be laterally offset to be placed closer to the sidewall 32 of the dielectric layer 20 than to the sidewall 33 of the dielectric layer 20. The cavity 22 may have a width dimension W1 in a lateral direction. A portion of the dielectric layer 20 is positioned between the cavity 22 and the sidewall 32, a portion of the dielectric layer 20 is positioned between the cavity 22 and the sidewall 33, and a portion of the dielectric layer 20 is positioned between the cavity 22 and the bottom 31.

Figure 4:
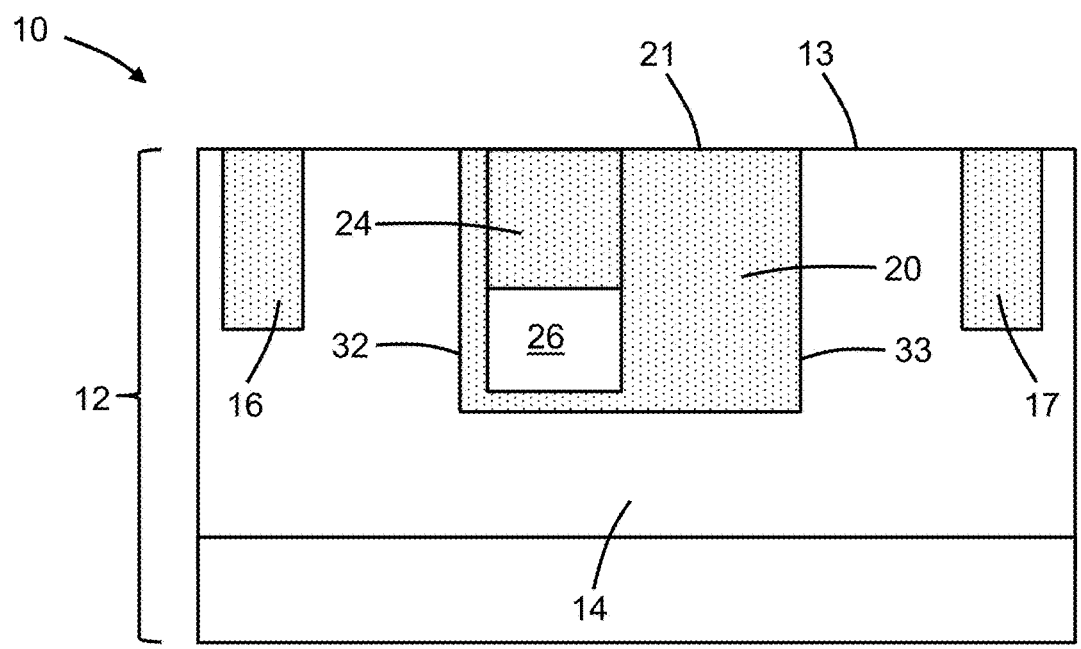
FIG. 4 is a cross-sectional view of the structure at a fabrication stage subsequent to FIG. 3.

With reference to FIG. 4 in which like reference numerals refer to like features in FIG. 3 and at a subsequent fabrication stage, a dielectric layer 24 is formed inside the cavity 22. The dielectric layer 24, which may partially fill an upper portion of the cavity 22, may be comprised of a dielectric material, such as silicon dioxide, that is deposited and planarized. An air gap 26 is trapped or formed inside a lower portion of the cavity 22. The air gap 26, which is unfilled by solid dielectric material, may be characterized by a permittivity or dielectric constant of near unity (i.e., vacuum permittivity). The air gap 26 may be filled by atmospheric air at or near atmospheric pressure, may be filled by another gas at or near atmospheric pressure, or may contain atmospheric air or another gas at a sub-atmospheric pressure (e.g., a partial vacuum).

The air gap 26 is laterally positioned between the sidewall 32 and the sidewall 33. In an embodiment, the air gap 26 may be laterally positioned closer to the sidewall 32 than to the sidewall 33. The air gap 26 is surrounded by solid dielectric material having a higher dielectric constant. In particular, the sides and bottom of the air gap 26 are surrounded by the dielectric material of the dielectric layer 20, and the dielectric material of the dielectric layer 24 covers and closes the top of the air gap 26. In an embodiment, the air gap 26 may have a width dimension that is equal to the width dimension W1 of the cavity 22. In an embodiment, the air gap 26 may have a width dimension that is less than the width dimension W1 of the cavity 22 if, for example, some of the dielectric material of the dielectric layer 24 deposits on the sidewalls of the cavity 22.

Figure 5:
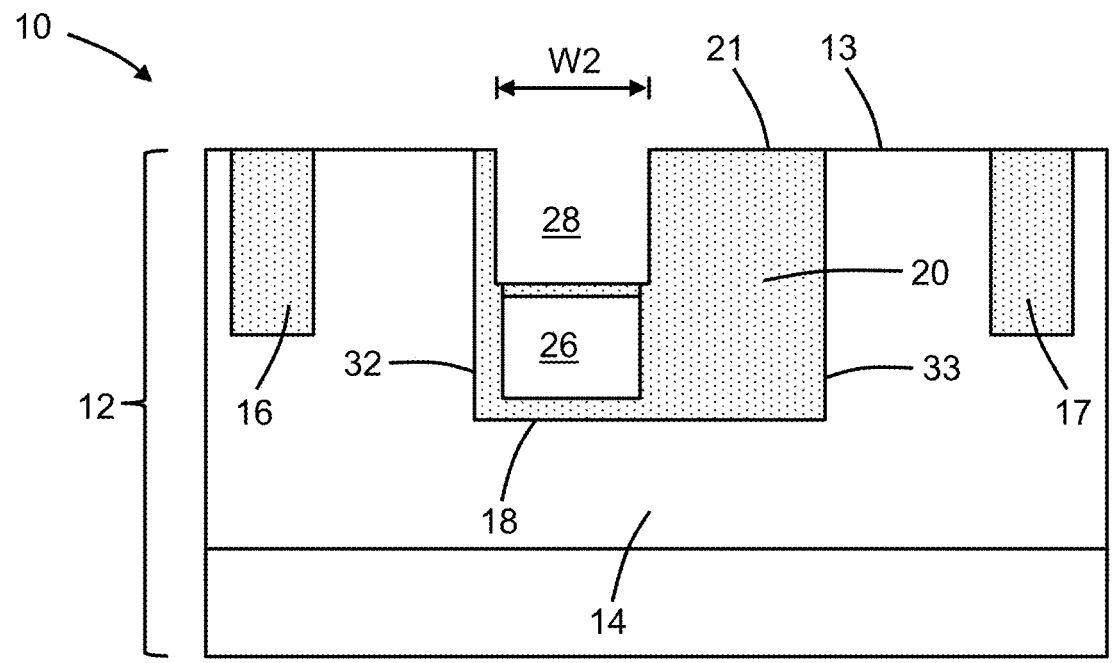
FIG. 5 is a cross-sectional view of the structure at a fabrication stage subsequent to FIG. 4.

With reference to FIG. 5 in which like reference numerals refer to like features in FIG. 4 and at a subsequent fabrication stage, a trench 28 may be patterned in the dielectric material of the dielectric layer 20 and the dielectric layer 24 by lithography and etching processes. To that end, an etch mask may be formed by a lithography process over the semiconductor substrate 12. The etch mask may include a layer of a photoresist applied by a spin-coating process, pre-baked, exposed to light projected through a photomask, baked after exposure, and developed with a chemical developer to define an opening at the intended location for the trench 28. An etching process is used to form the trench 28 in the dielectric layer 20 and the dielectric layer 24 at the location of the opening in the etch mask. The etch mask may be stripped after forming the trench 28.

The trench 28 may have a width dimension W2 that is greater than the width dimension W1 of the cavity 22. The maximum depth of the trench 28 relative to the top surface 21 of the dielectric layer 20 may be less than the shallowest depth of the air gap 26 relative to the top surface 21 of the dielectric layer 20 such that the trench 28 does not penetrate the air gap 26 and the air gap 26 remains sealed.

Figure 6:
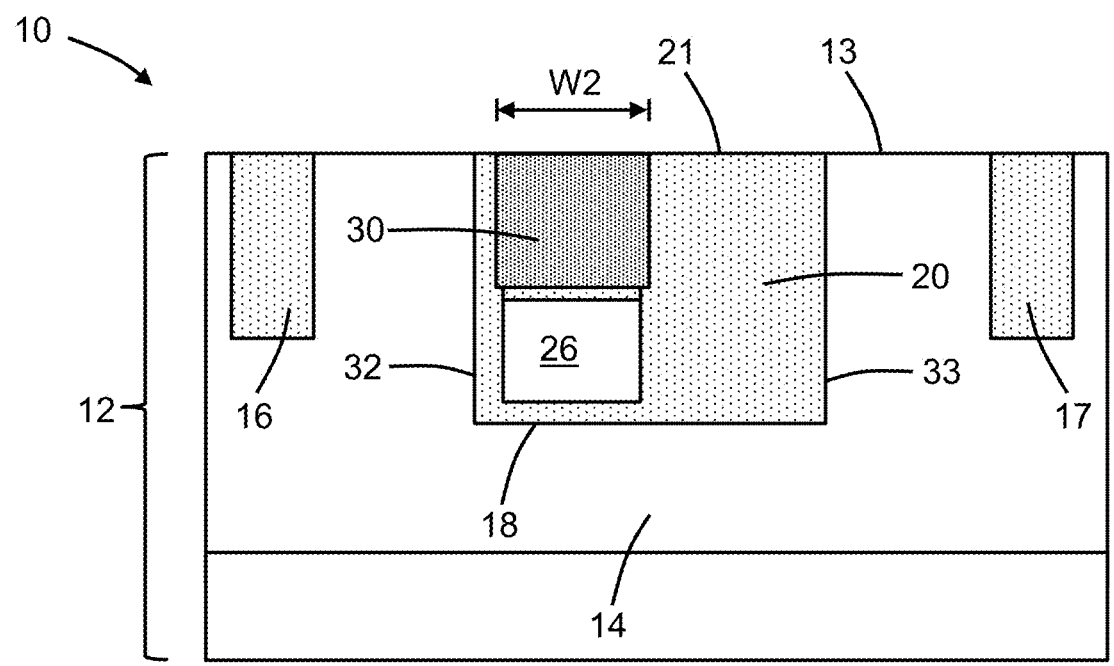
FIG. 6 is a cross-sectional view of the structure at a fabrication stage subsequent to FIG. 5.

With reference to FIG. 6 in which like reference numerals refer to like features in FIG. 5 and at a subsequent fabrication stage, a conductor layer 30 may be formed inside the trench 28 and may adopt the shape of the trench 28. The conductor layer 30 may be comprised of a conductor, such as doped polysilicon. In an embodiment, the conductor layer 30 may fully fill the trench 28. The conductor layer 30 may provide a gate of the laterally-diffused metal-oxide-semiconductor device.

The conductor layer 30 is disposed in the dielectric layer 20 vertically between the top surface 21 of the dielectric layer 20 and the air gap 26 such that the air gap 26 is below the conductor layer 30, and the conductor layer 30 is disposed in the dielectric layer 20 laterally between the sidewall 32 and the sidewall 33. In an embodiment, an entirety of the air gap 26 may be disposed below the bottom of the conductor layer 30. In an embodiment, no portion of the air gap 26 may be disposed between the bottom of the conductor layer 30 and the top surface 21 of the dielectric layer 20. In an embodiment, the conductor layer 30 may be laterally disposed in the dielectric layer 20 closer to the sidewall 32 than to the sidewall 33. A portion of the dielectric material of the dielectric layer 24 is disposed vertically between the bottom of the conductor layer 30 and the air gap 26. Portions of the dielectric material of the dielectric layer 20 are laterally disposed between the conductor layer 30 and the sidewalls 32, 33 and bottom 31. The conductor layer 30 may overlap with the air gap 26. In an embodiment, the conductor layer 30 may fully overlap with the air gap 26. In an embodiment, the conductor layer 30 may have the same width dimension W2 as the trench 28, which is greater than the width dimension W1 of the cavity 22. In an embodiment, the conductor layer 30 may be centered with the air gap 26.

Figure 7:
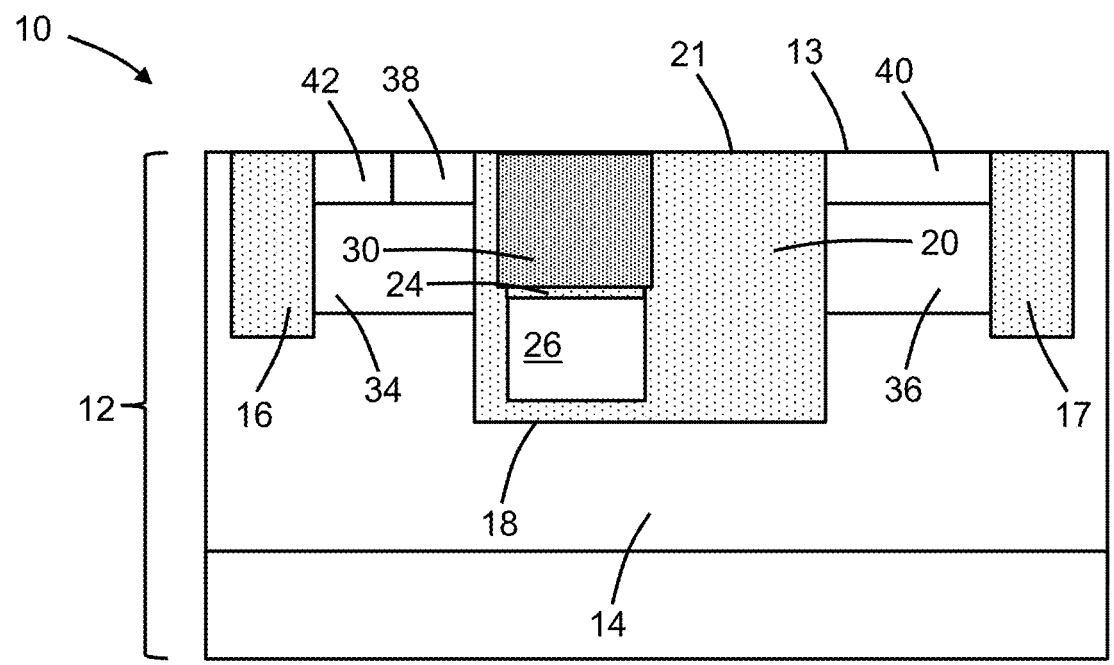
FIG. 7 is a cross-sectional view of the structure at a fabrication stage subsequent to FIG. 6.

With reference to FIG. 7 in which like reference numerals refer to like features in FIG. 6 and at a subsequent fabrication stage, wells 34, 36 having opposite conductivity types may be formed in respective portions of the semiconductor substrate 12 adjacent to the dielectric layer 20 and the conductor layer 30 disposed within the dielectric layer 20. The dielectric layer 20, the air gap 26, and the conductor layer 30 are laterally positioned between the well 34 and the well 36. The well 34 is formed in the portion of the semiconductor substrate 12 between the shallow trench isolation region 16 and the dielectric layer 20. The well 36 is formed in the portion of the semiconductor substrate 12 between the shallow trench isolation region 17 and the dielectric layer 20.

In an embodiment, the well 34 may contain a concentration of a p-type dopant (e.g., boron) to provide p-type conductivity. The well 34 may be formed by implanting ions, such as ions including the p-type dopant, with an implantation mask having an opening defining the intended location for the well 34 in the semiconductor substrate 12. The implantation conditions, such as ion species, dose, and kinetic energy, may be selected to tune the electrical and physical characteristics of the well 34.

In an embodiment, the well 36 may contain a concentration of an n-type dopant (e.g., arsenic or phosphorus) to provide n-type conductivity. The well 36 may be formed by implanting ions, such as ions including the n-type dopant, with an implantation mask having an opening defining the intended location for the well 36 in the semiconductor substrate 12. The implantation conditions, such as ion species, dose, and kinetic energy, may be selected to tune the electrical and physical characteristics of the well 36.

Doped regions 38, 40 and a doped region 42 are formed in respective portions of the semiconductor substrate 12. More specifically, the doped region 38 and the doped region 42 are disposed in the well 34 with the doped region 38, and the doped region 40 is disposed in the well 36. The doped region 42 may have an opposite conductivity type from the doped regions 38, 40. The doped region 38 may be laterally disposed between the doped region 42 and the sidewall 32. The doped region 38 may abut and adjoin the doped region 42, and the doped region 38 and the doped region 42 may be laterally disposed between the shallow trench isolation region 16 and the conductor layer 30. The doped region 40 may be laterally disposed between the shallow trench isolation region 17 and the sidewall 33. The doped region 38 and the doped region 40 may provide a source and a drain of the laterally-diffused metal-oxide-semiconductor device. In an embodiment, the air gap 26 may be positioned closer to the doped region 38 than to the doped region 40.

The doped region 38 may be doped to have an opposite conductivity type from the well 34, and the doped region 40 may be doped to the same conductivity type as the well 36 but at a higher dopant concentration. In an embodiment, the doped regions 38, 40 may contain a concentration of an n-type dopant (e.g., arsenic or phosphorus) to provide n-type conductivity. The doped regions 38, 40 may be concurrently formed by selectively implanting ions, such as ions including the n-type dopant, with an implantation mask having openings defining the intended locations for the doped regions 38, 40 in the semiconductor substrate 12. The implantation conditions, such as ion species, dose, and kinetic energy, may be selected to tune the electrical and physical characteristics of the doped regions 38, 40.

The doped region 42 may be doped to the same conductivity type as the well 34 but at a higher dopant concentration. In an embodiment, the doped region 42 may contain a concentration of a p-type dopant (e.g., boron) to provide p-type conductivity. The doped region 42 may be formed by selectively implanting ions, such as ions including the p-type dopant, with an implantation mask having an opening defining the intended location for the doped region 42 in the semiconductor substrate 12. The implantation conditions, such as ion species, dose, and kinetic energy, may be selected to tune the electrical and physical characteristics of the doped region 42.

A dielectric layer (not shown) may be formed over the structure 10. Contacts may be formed in the dielectric layer that are physically and electrically coupled to the doped region 38 and the doped region 42. Contacts may be formed in the dielectric layer that are physically and electrically coupled to the doped region 38, and contacts may be formed in the dielectric layer that are physically and electrically coupled to the conductor layer 30.

The structure 10 may exhibit improved performance in comparison with a conventional laterally-diffused metal-oxide-semiconductor device. In that regard, the reduced dielectric constant of the air gap 26, in comparison with solid dielectric material, reduces parasitic capacitance during operation. The improved performance may be achieved without compromising other electrical parameters, such as the threshold voltage of the laterally-diffused metal-oxide-semiconductor device embodied in the structure 10.

Figure 8:
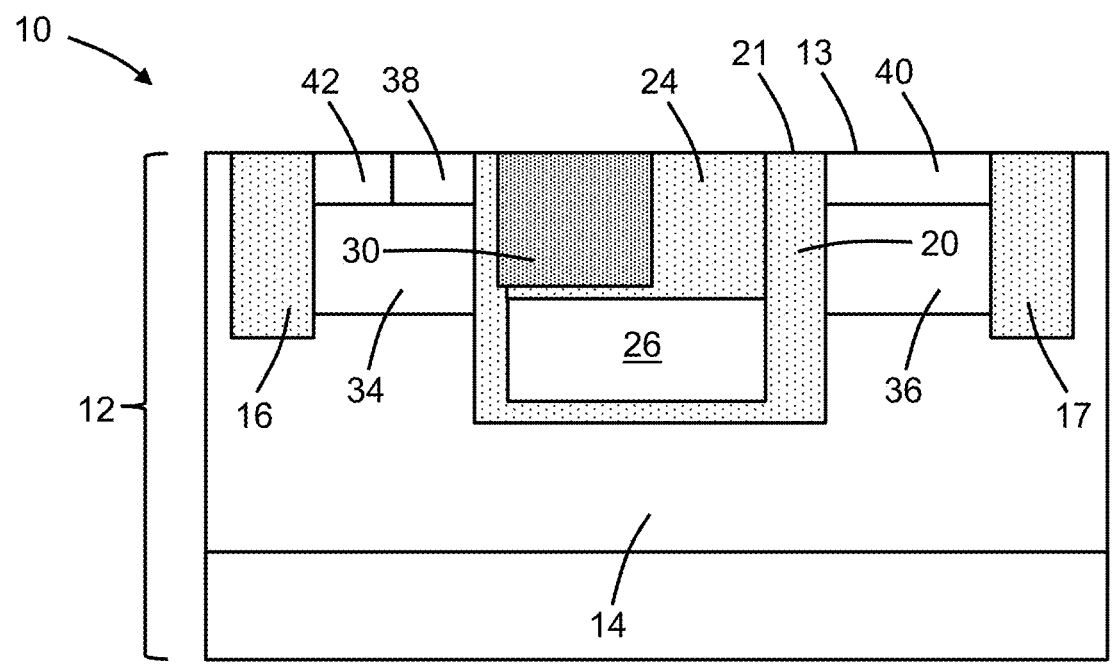
FIG. 8 is a cross-sectional view of a structure in accordance with alternative embodiments of the invention.

With reference to FIG. 8 in which like reference numerals refer to like features in FIG. 7 and in accordance with alternative embodiments of the invention, the width dimension of the air gap 26 may be increased to be greater than the width dimension W2 of the conductor layer 30. The conductor layer 30 overlaps with the widened air gap 26 such that at least a portion of the air gap 26 is below the conductor layer 30. In an embodiment, the conductor layer 30 may overlap with a portion of the widened air gap 26 and not overlap with a different portion of the air gap 26. In an embodiment, the air gap 26 may be centered between the sidewall 32 and the sidewall 33.

Figure 9:
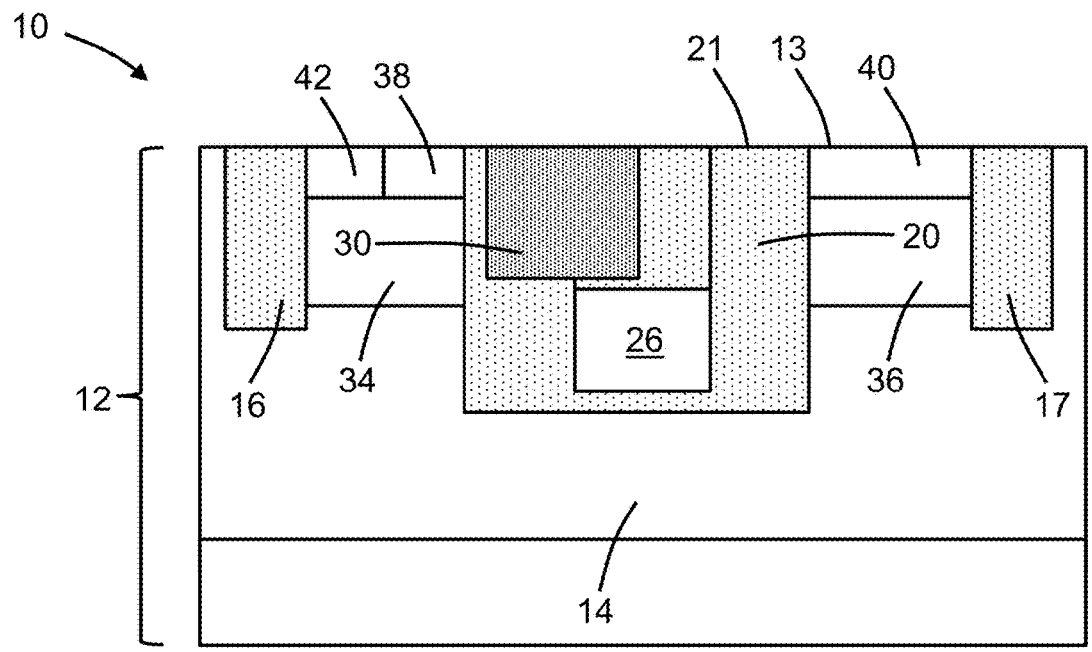
FIG. 9 is a cross-sectional view of a structure in accordance with alternative embodiments of the invention.

With reference to FIG. 9 in which like reference numerals refer to like features in FIG. 7 and in accordance with alternative embodiments of the invention, the air gap 26 may be laterally offset relative to the conductor layer 30. In an embodiment, the air gap 26 may be positioned closer to the doped region 40 than to the doped region 38. The conductor layer 30 overlaps with a portion of the laterally-offset air gap 26 such that at least a portion of the air gap 26 is below the conductor layer 30. In an embodiment, the air gap 26 may be positioned in the dielectric layer 20 closer to the sidewall 33 than to the sidewall 32.

Figure 10:
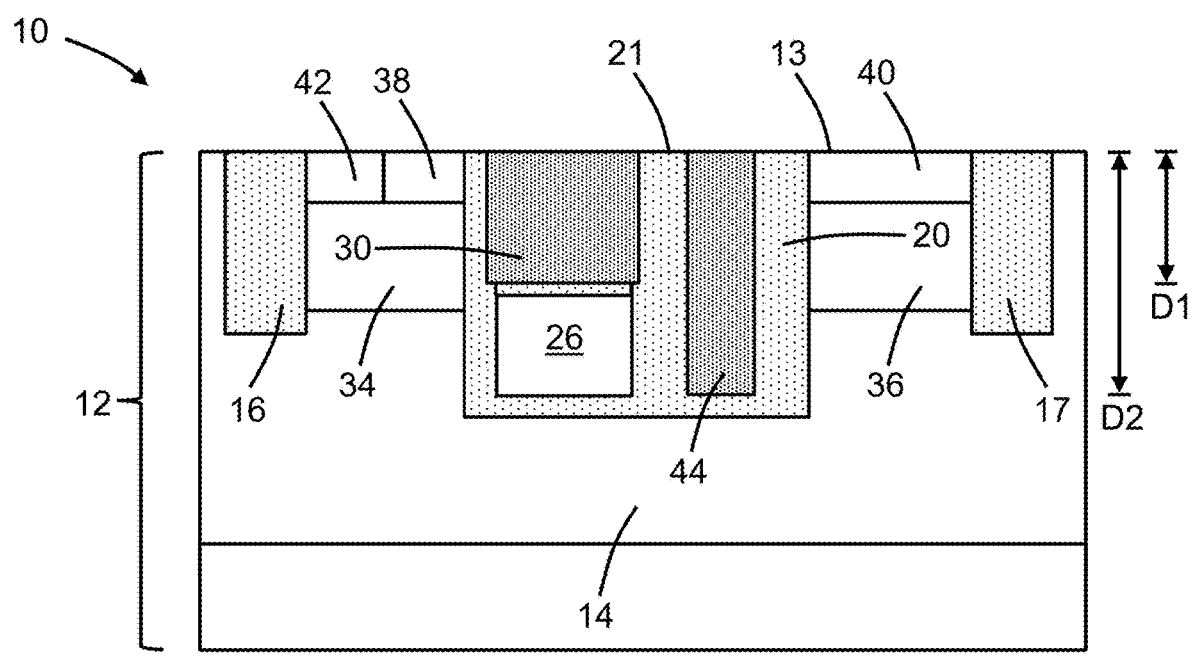
FIG. 10 is a cross-sectional view of a structure in accordance with alternative embodiments of the invention.

With reference to FIG. 10 in which like reference numerals refer to like features in FIG. 7 and in accordance with alternative embodiments of the invention, the structure 10 may be modified to add a conductor layer 44 inside a trench that is patterned in the dielectric layer 20 adjacent to the conductor layer 30 and the air gap 26. In an embodiment, the conductor layer 44 may be comprised of doped polysilicon, and the conductor layer 44 may be concurrently formed along with the conductor layer 30. The conductor layer 44 may provide a field plate of the laterally-diffused metal-oxide-semiconductor device.

The conductor layer 30 of the gate extends to a depth D1 in the dielectric layer 20. The conductor layer 44 of the field plate extends to a depth D2 in the dielectric layer 20 that is greater than the depth D1. The conductor layer 30 is laterally positioned between the sidewall 32 and an upper portion of the conductor layer 44. The air gap 26 is laterally positioned between the sidewall 32 and a lower portion of the conductor layer 44. The air gap 26 may enable the addition of the field plate embodied in the conductor layer 44 to the structure 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a laterally-diffused metal-oxide-semiconductor device, the structure comprising:
    a semiconductor substrate including a trench, the trench having a first sidewall and a second sidewall;
    a first dielectric layer inside the trench, the first dielectric layer comprising a first dielectric material;
    a source in the semiconductor substrate, the source adjacent to the first sidewall of the trench;
    a drain in the semiconductor substrate, the drain adjacent to the second sidewall of the trench;
    a gate in the first dielectric layer, the gate laterally between the first sidewall of the trench and the second sidewall of the trench;
    a second dielectric layer comprising a second dielectric material; and
    an air gap in the first dielectric layer, the air gap below the gate, and the air gap laterally between the first sidewall of the trench and the second sidewall of the trench,
    wherein the air gap is fully surrounded by the first dielectric material and the second dielectric material.

2. The structure of claim 1 wherein the second dielectric layer includes a portion between the air gap and the gate.

3. The structure of claim 1 wherein the air gap has a dielectric constant of near unity.

4. The structure of claim 1 wherein the air gap has a first width, and the gate has a second width that is greater than the first width.

5. The structure of claim 1 wherein the air gap has a first width, and the gate has a second width that is less than the first width.

6. The structure of claim 1 wherein the air gap is positioned closer to the first sidewall than to the second sidewall.

7. The structure of claim 1 wherein the air gap is positioned closer to the second sidewall than to the first sidewall.

8. The structure of claim 1 wherein the air gap is centered between the first sidewall and the second sidewall.

9. The structure of claim 1 wherein the first dielectric layer has a top surface, and the gate is positioned between the air gap and the top surface of the first dielectric layer.

10. The structure of claim 1 wherein the first dielectric layer has a bottom, a first portion of the first dielectric layer is positioned between the first sidewall and the gate, and a second portion of the first dielectric layer is positioned between the bottom of the first dielectric layer and the gate.

11. A structure for a laterally-diffused metal-oxide-semiconductor device, the structure comprising:
    a semiconductor substrate including a trench, the trench having a first sidewall and a second sidewall;
    a first dielectric layer inside the trench;
    a source in the semiconductor substrate, the source adjacent to the first sidewall of the trench;
    a drain in the semiconductor substrate, the drain adjacent to the second sidewall of the trench;
    a gate in the first dielectric layer, the gate laterally between the first sidewall of the trench and the second sidewall of the trench;
    an air gap in the first dielectric layer, the air gap below the gate, and the air gap laterally between the first sidewall of the trench and the second sidewall of the trench; and
    a field plate in the first dielectric layer, the field plate including a first portion and a second portion,
    wherein the air gap is laterally positioned between the first portion of the field plate and the first sidewall of the trench.

12. The structure of claim 11 wherein the gate is laterally positioned between the second portion of the field plate and the first sidewall of the trench.

13. The structure of claim 11 wherein the first dielectric layer has a top surface, the gate extends from the top surface to a first depth in the first dielectric layer, and the field plate extends from the top surface to a second depth in the first dielectric layer that is greater than the first depth.

14. The structure of claim 11 wherein the gate includes a first conductor layer, and the field plate includes a second conductor layer.

15. The structure of claim 14 wherein the first conductor layer and the second conductor layer comprise doped polysilicon.

16. The structure of claim 11 wherein the first dielectric layer has a top surface, the gate is positioned between the air gap and the top surface of the first dielectric layer, and the second portion of the field plate is positioned between the first portion of the field plate and the top surface of the first dielectric layer.

17. The structure of claim 11 wherein the first dielectric layer comprises a first dielectric material, and further comprising:
    a second dielectric layer comprising a second dielectric material,
    wherein the air gap is fully surrounded by the first dielectric material and the second dielectric material.

18. A structure for a laterally-diffused metal-oxide-semiconductor device, the structure comprising:
    a semiconductor substrate including a trench, the trench having a first sidewall and a second sidewall;
    a first dielectric layer inside the trench;
    a source in the semiconductor substrate, the source adjacent to the first sidewall of the trench;
    a drain in the semiconductor substrate, the drain adjacent to the second sidewall of the trench;
    a gate in the first dielectric layer, the gate laterally between the first sidewall of the trench and the second sidewall of the trench;
    an air gap in the first dielectric layer, the air gap below the gate, and the air gap laterally between the first sidewall of the trench and the second sidewall of the trench; and
    a field plate in the first dielectric layer, the field plate including a first portion and a second portion,
    wherein the air gap and the first portion of the field plate are laterally positioned between the first sidewall of the trench and the second sidewall of the trench.

19. The structure of claim 18 wherein the gate is laterally positioned between the second portion of the field plate and the first sidewall of the trench.

20. The structure of claim 18 wherein the first dielectric layer comprises a first dielectric material, and further comprising:
    a second dielectric layer comprising a second dielectric material,
    wherein the air gap is fully surrounded by the first dielectric material and the second dielectric material.

* * * * *